(12) United States Patent
Park et al.

(10) Patent No.: US 6,176,969 B1
(45) Date of Patent: Jan. 23, 2001

(54) BAFFLE PLATE OF DRY ETCHING APPARATUS FOR MANUFACTURING SEMICONDUCTOR DEVICES

(75) Inventors: Jeong-hyuck Park; Jong-wook Choi, both of Suwon (KR)

(73) Assignee: Samsung Electronics Co., Ltd., Suwon (KR)

(*) Notice: Under 35 U.S.C. 154(b), the term of this patent shall be extended for 0 days.

(21) Appl. No.: 09/296,532

(22) Filed: Apr. 22, 1999

(30) Foreign Application Priority Data

Apr. 22, 1998 (KR) .................................................. 98-14379

(51) Int. Cl.[7] ........................... H05H 1/00; H01L 21/3065
(52) U.S. Cl. ................. 156/345; 118/723 R; 118/723 E; 118/723 ER
(58) Field of Search ....................... 156/345; 118/723 R, 118/723 E, 723 ER (56) References Cited

U.S. PATENT DOCUMENTS 5,605,637 * 2/1997 Shan et al. ............................ 156/345
6,051,100 * 4/2000 Walko, II ............................. 156/345

* cited by examiner

Primary Examiner—Thi Dang
(74) Attorney, Agent, or Firm—Jones Volentine, LLC (57) ABSTRACT

An annular ring shaped baffle plate disposed between a process chamber and a vacuum chamber of a dry etching apparatus. A plurality of slits are formed radially along the annular ring and extend from a top surface of the annular ring to a bottom surface of the annular ring. The slits are circumferentially spaced from each other, and each of the slits has an upper section that is tapered and a lower section that has a constant width. Alternatively, the slits may be replaced by a plurality of discharging regions formed in the annular ring, with the discharging regions having a circumferential width that is greater than a radial length.

17 Claims, 11 Drawing Sheets

BAFFLE PLATE OF DRY ETCHING APPARATUS FOR MANUFACTURING SEMICONDUCTOR DEVICES

BACKGROUND OF THE INVENTION

1. Field of the Invention

The present invention relates to a baffle plate of a dry etching apparatus for manufacturing semiconductor devices, and more particularly, a baffle plate for minimizing the vacuum level fluctuations in a process chamber, as well as minimizing the accumulation of particles that are generated as by-products of the semiconductor device fabrication process.

2. Description of the Related Art

Generally, semiconductor devices are manufactured by forming multiple layers on a semiconductor substrate wafer, and forming circuit patterns thereon according to the desired electrical properties of a specified semiconductor device.

The patterns on the semiconductor substrate are typically formed by selectively removing portions of the layers on the semiconductor substrate using an etching process.

Conventional etching processes are categorized as wet etching (using chemicals), dry etching (using plasma), and reactive ion etching, which is a type of dry etching with improved plasma efficiency.

Figure 1:
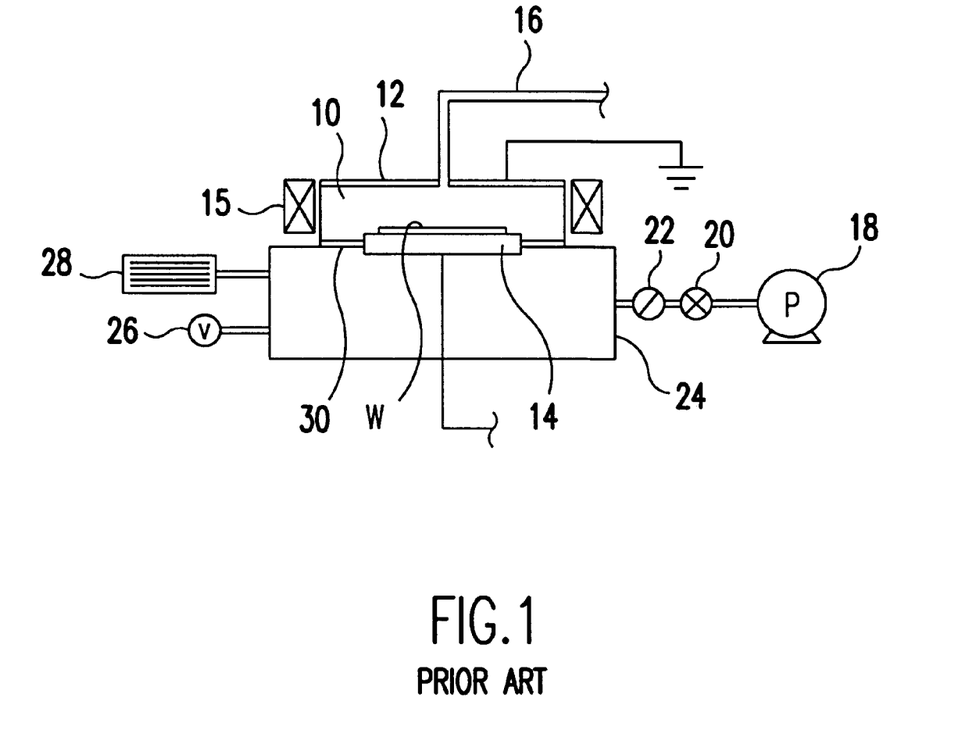
FIG. 1 is a schematic diagram showing a conventional etching apparatus for manufacturing semiconductor devices.

A conventional reactive ion etching apparatus is shown in FIG. 1, and includes an upper electrode 12 and a lower electrode 14, to which high frequency power is applied for forming the plasma inside a process chamber 10. When power is applied to the lower electrode 14 the upper electrode 12 functions as ground. The lower electrode 14 is located under the chuck for mounting the wafer W. A transfer apparatus 28 transports the wafers to and from the chuck.

A magnetic coil 15 surrounds the process chamber 10 in order to generate a magnetic field during the etching process. A gas supply line 16 is provided on the upper electrode 12 for supplying, to the process chamber 10, a reaction gas and other gases required for the etching process.

A vacuum chamber 24 is disposed under the process chamber 10, with the vacuum chamber 24 being connected to a vacuum pump 18 for forming the vacuum in the process chamber 10. Valves 20 and 22 are connected between the vacuum chamber 24 and the vacuum pump 18. Gate valve 20 is selectively opened/closed in conjunction with the operation of the vacuum pump 18. Vacuum control valve 22 controls the degree or level of the vacuum in the vacuum chamber 24. This is accomplished by controlling the opening angle of the vacuum control valve 22.

A vacuum indicator 26 is connected to the vacuum chamber 24 for readily displaying the degree of vacuum in the vacuum chamber 24. The vacuum indicator 26 senses the degree of vacuum in the vacuum chamber 24, and inputs it to a controlling part (not shown). Accordingly, the controlling part controls the opening/closing of the vacuum control valve 22, which in turn controls the degree of vacuum in the vacuum chamber 24.

In this embodiment, the degree of vacuum in the process chamber 10 should basically be the same as the degree of vacuum in the vacuum chamber 24, which can easily be ascertained by the vacuum indicator 26 display.

A baffle plate 30 is disposed between the process chamber 10 and the vacuum chamber 24, and has slits for discharging the non-reacting gases and polymer by-products remaining inside the process chamber 10 to the vacuum chamber 24.

The baffle plate 30 essentially surrounds the chuck of the lower electrode 14, such that the inner circumference of the baffle plate 30 confronts the outer circumference of the chuck. To effect a wafer transfer, the chuck would descend from this engaged position, move toward the transfer apparatus 28, and thereafter the wafer is mounted on the chuck. The chuck then moves back toward the baffle plate 30 and then rises to the engaged position confronting the baffle plate 30.

Figure 2:
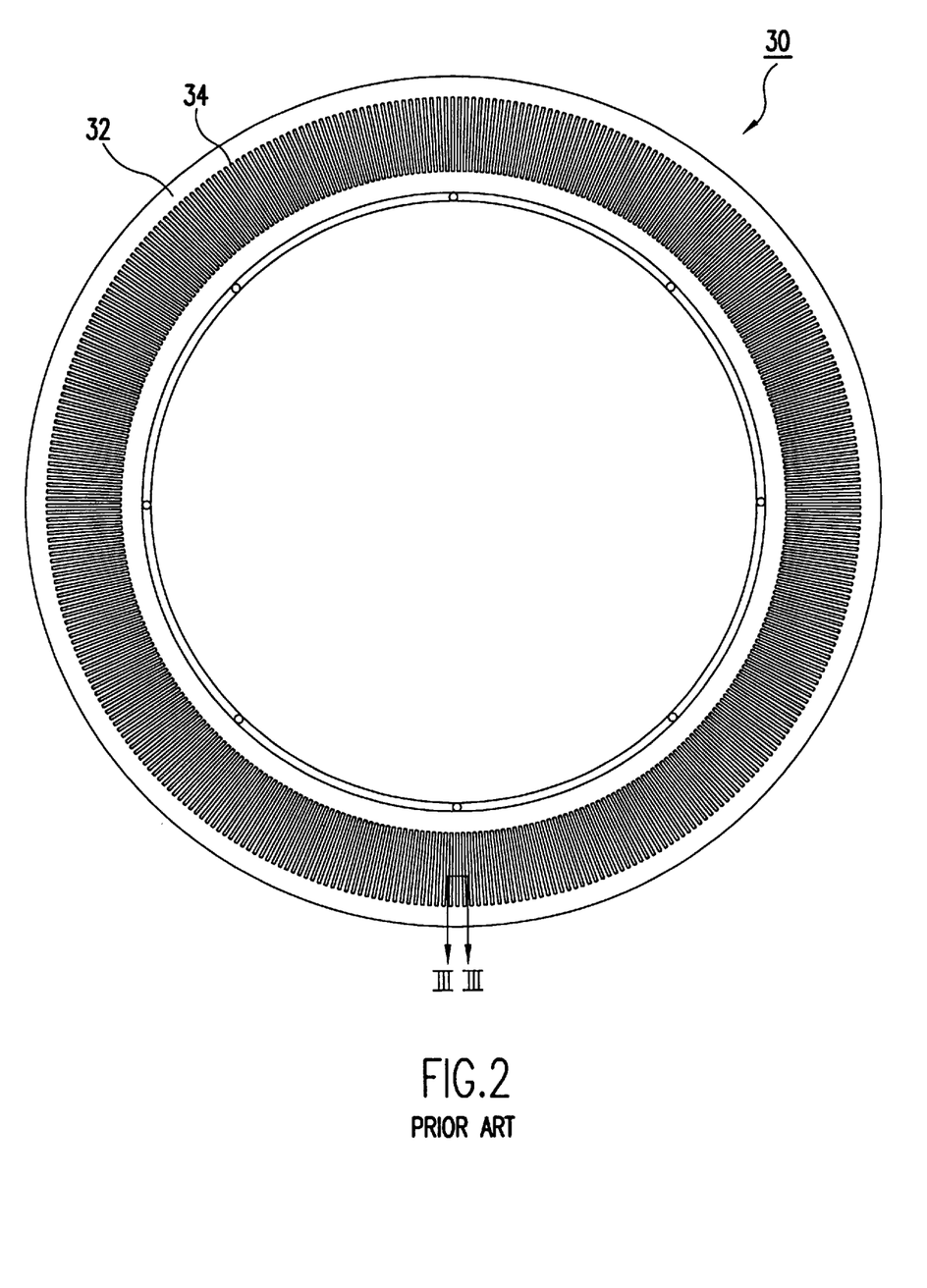
FIG. 2 is a plan view of a conventional baffle plate used in the apparatus of FIG. 1.

As shown in FIG. 2 the baffle plate 30 comprises a plurality of slits 34 formed radially in the annular ring portion 32 of the baffle plate 30 and spaced a certain distance from each other. In the conventional baffle plate, 360 slits are provided.

Figure 3:
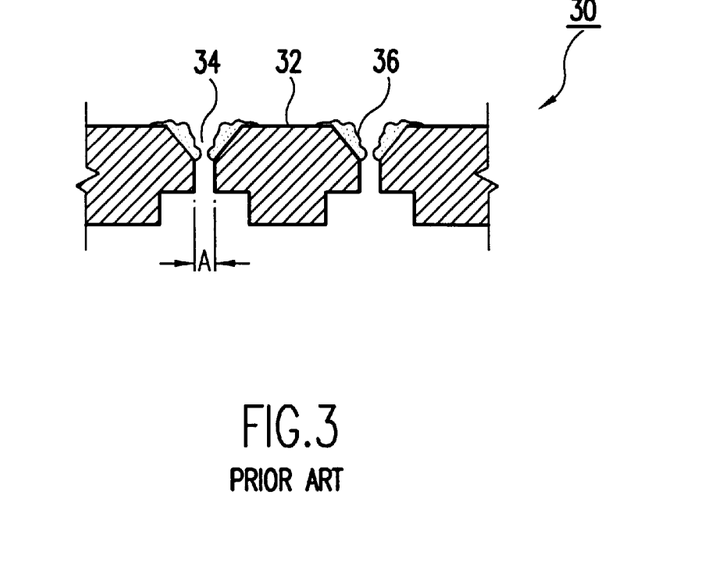
FIG. 3 is a cross-sectional view of the baffle plate of FIG. 2 taken along the line III—III.

As shown in FIG. 3 the slit 34 has three distinct sections. The upper 40 part of the slit 34 has an inclined surface, with the widest portion facing the process chamber 10 and thereafter converging as it approaches the middle part. The middle part is vertically formed with a constant width. The lower part facing the vacuum chamber 24 is also vertically formed, but with a constant width greater than that of the middle part.

As described above, the non-reacting gases and polymer 36 by-products remaining inside the process chamber 10 are discharged into the vacuum chamber 24 through the slits 34 of the baffle plate 30. However, as shown in FIG. 3, not all the polymer by-products are discharged to the vacuum chamber 24, and a certain amount of polymer 36 remains on the annular ring 32 and slits 34.

As one could readily see, if the width of the middle part of the slit 34 is A (e.g., 0.8 mm) the polymer 36 deposits serve to reduce the width of the opening to something less than A, which then hinders the remaining non-reacted gases in the process chamber 10 from being discharged to the vacuum chamber 24.

The remaining non-reacted gases in the process chamber 10 changes the degree of vacuum in the process chamber 10. Accordingly, the degree of vacuum as indicated by the vacuum indicator 26 and the degree of vacuum in the process chamber 10 are different.

Figure 4:
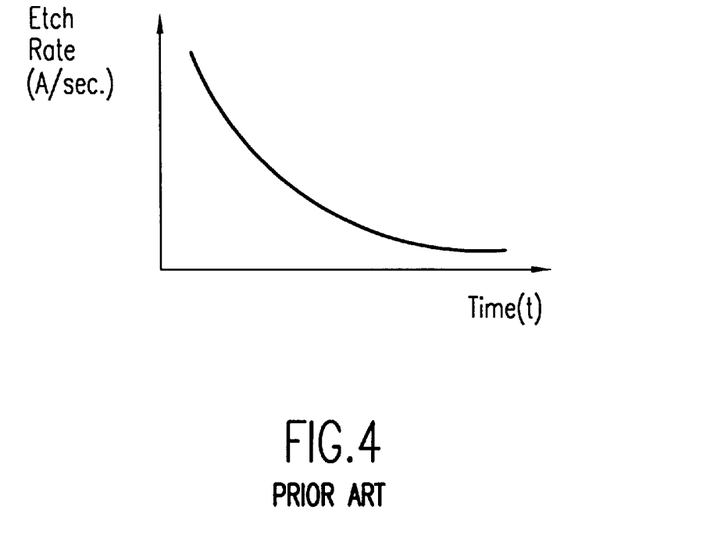
FIG. 4 is a graphical representation showing the etch rate versus time characteristics of the etching process using the apparatus of FIG. 1.

For example, if initially about 35 mTorr of vacuum is formed inside the process chamber 10 and the vacuum chamber 24, as the etching process proceeds the degree of vacuum in the process chamber 10 increases to above 35 mTorr due to the polymer 36 by-products generated and attached to the annular ring 32 and slits 34, while the vacuum indicator 26 senses the vacuum in the vacuum chamber 24 as 35 mTorr. As shown in FIG. 4, the etch rate is inversely proportional to the length of the etching process time due to the changes in the degree of vacuum in the process chamber 10, that is, the etch rate is decreased.

In particular, during an etching process to form contact holes in an oxide film ($SiO_2$ film) on a semiconductor substrate using $CHF_3$ as the main reaction gas, and CO as the supplementary gas, polymer 36 by-products are rapidly generated which thereafter adhere to the surface of the annular ring 32 and slits 34. More specifically, the $CHF_3$ supplied as the main reaction gas is dissociated in the plasma state into $CHF_2$+F* (* : radical), that is, the active radical F* reacts with an etched layer, $SiO_2$, forming $Si_xF_y$ and $O_2$. The $O_2$ then reacts with the CO supplied as the supplementary gas, thereby generating the polymer 36 by-product.

Accordingly, the degree of vacuum in the process chamber 10 changes due to the polymer 36 attached on the annular ring 32 and the slits 34, but this change, as described above, is not accurately reflected at the vacuum indicator 26, whereby the etching process is inadvertently permitted to proceed at decreased etch rate.

Figure 5:
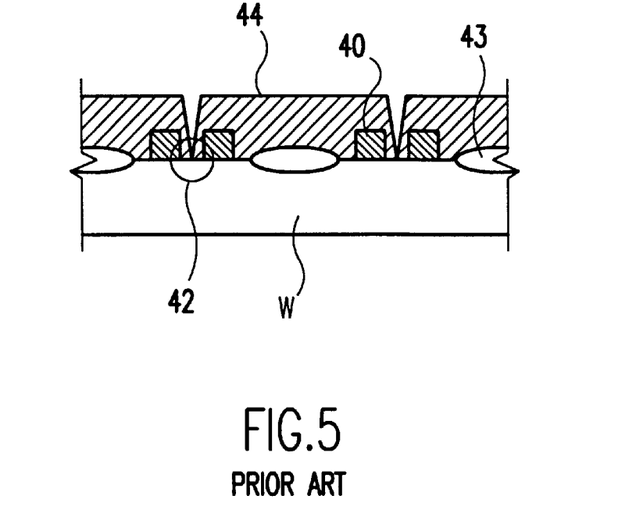
FIG. 5 is a cross-sectional view of contact holes formed on a semiconductor device using the apparatus of FIG. 1.

FIG. 5 depicts contact holes formed through a certain layer 44 on a semiconductor substrate wafer W having a gate electrode 40 and a field oxide film 43. Because of the decreased etch rate, however, the bottom 42 portion of the contact hole does not reach the wafer, or the width of the contact hole is too small to perform its intended function.

In addition, the polymer 36 adhered to the annular ring 32 and slits 34 serves as source of contaminating particles, which thereafter adhere to the wafer inside the process chamber 10 and cause process failures during the etching process.

In summary, an etching apparatus having a conventional baffle plate suffers from two main problems. One is the degree of vacuum inside the process chamber changes due to the attached polymer deposits. The other is the polymer deposits serve as a source of contaminating particles, thereby resulting in a decrease in the productivity and reliability of the semiconductor device manufacturing process.

SUMMARY OF THE INVENTION

The present invention is directed to a baffle plate of a dry etching apparatus for manufacturing semiconductor devices that minimizes changes in the degree of vacuum inside the process chamber caused by the polymer by-products generated inside the process chamber.

Another object of the present invention is to provide a baffle plate that increases the reliability of the fabrication process by minimizing the generation of contaminating polymer by-products inside the process chamber.

To achieve these and other advantages and in accordance with the purpose of the present invention as embodied and broadly described, there is provided a annular ring shaped baffle plate disposed between a process chamber and a vacuum chamber of a dry etching apparatus for manufacturing semiconductor devices. A plurality of slits are formed radially along the annular ring and extend from a top surface to a bottom surface of the annular ring, the slits being circumferentially spaced from each other. Each of the slits has an upper section extending at a positive slope from the top surface of the annular ring to a particular depth within the annular ring such that the upper section is tapered, and a lower section extending vertically from the particular depth to the bottom surface of the annular ring. The circumferential width of the upper section of the slit at the top surface of the annular ring is greater than a circumferential width at the particular depth. The circumferential width at the particular depth is equal to the circumferential width of the lower section of the slit at the bottom surface of the annular ring, such that the lower section has a constant width. Therefore, the area of the upper section of the slit at the top surface of the annular ring is greater than that of the lower section of the slit at the bottom surface of the annular ring.

The ratio of a vertical height of the tapered upper section of the slit and a vertical height of the lower section of the slit ranges between 1:1 to 5:1. The circumferential width of the upper section at the top surface of the annular ring ranges between 1.6 to 2.0 mm, and the circumferential width of the lower section ranges between 1.0 to 1.2 mm.

The tapered upper section forms surfaces that are inclined at an angle between 75° to 85°, preferably, 78°.

In another aspect of the present invention, the slits may be replaced by a plurality of discharging regions formed in the annular ring having a circular arc shape with a particular radial length. Each of the discharging regions preferably has the same area, with the combined area of the plurality of discharging regions being more than 50% of the area of the annular ring.

Preferably, a circumferential width of each of the discharging regions is greater than its radial length.

Preferably, the circumferential width of the discharging region at the top surface of the annular ring is greater than a circumferential width at the bottom surface of the annular ring, such that the discharging region is tapered.

Preferably, the radial length of the discharging region at the top surface of the annular ring is greater than the radial length of the discharging region at the bottom surface of the annular ring, such that the discharging region is tapered.

It is to be understood that both the foregoing general description and the following detailed description are exemplary and explanatory and are intended to provide further explanation of the invention as claimed.

DETAILED DESCRIPTION OF PREFERRED EMBODIMENTS

Reference will now be made in detail to the preferred embodiments of the present invention, examples of which are illustrated in the accompanying drawings.

Figure 6:
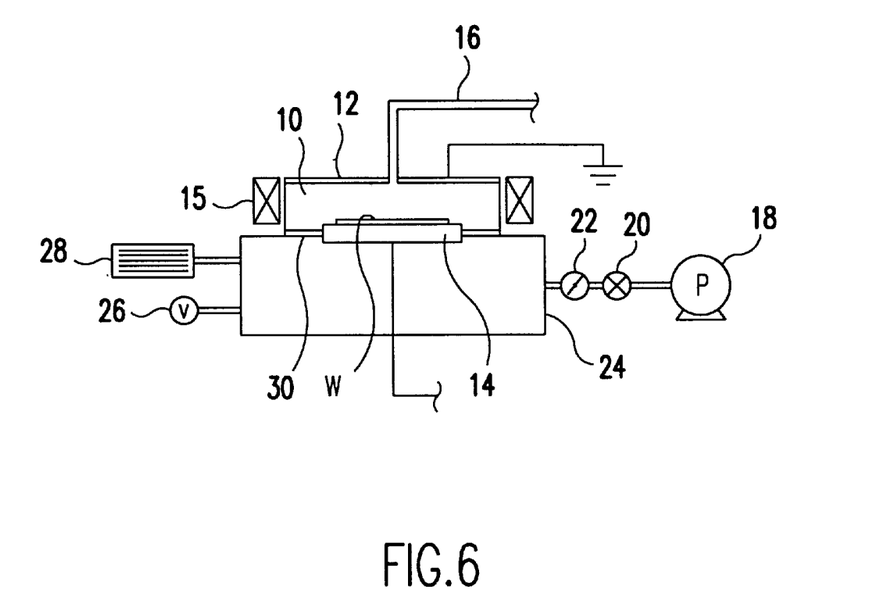
FIG. 6 illustrates an etching apparatus for manufacturing semiconductor devices according to the present invention.

FIG. 6 illustrates an etching apparatus for manufacturing semiconductor devices according to the present invention. Like numerals refer to like elements as previously described with respect to FIG. 1, and thus will not be described in detail here.

Figure 7:
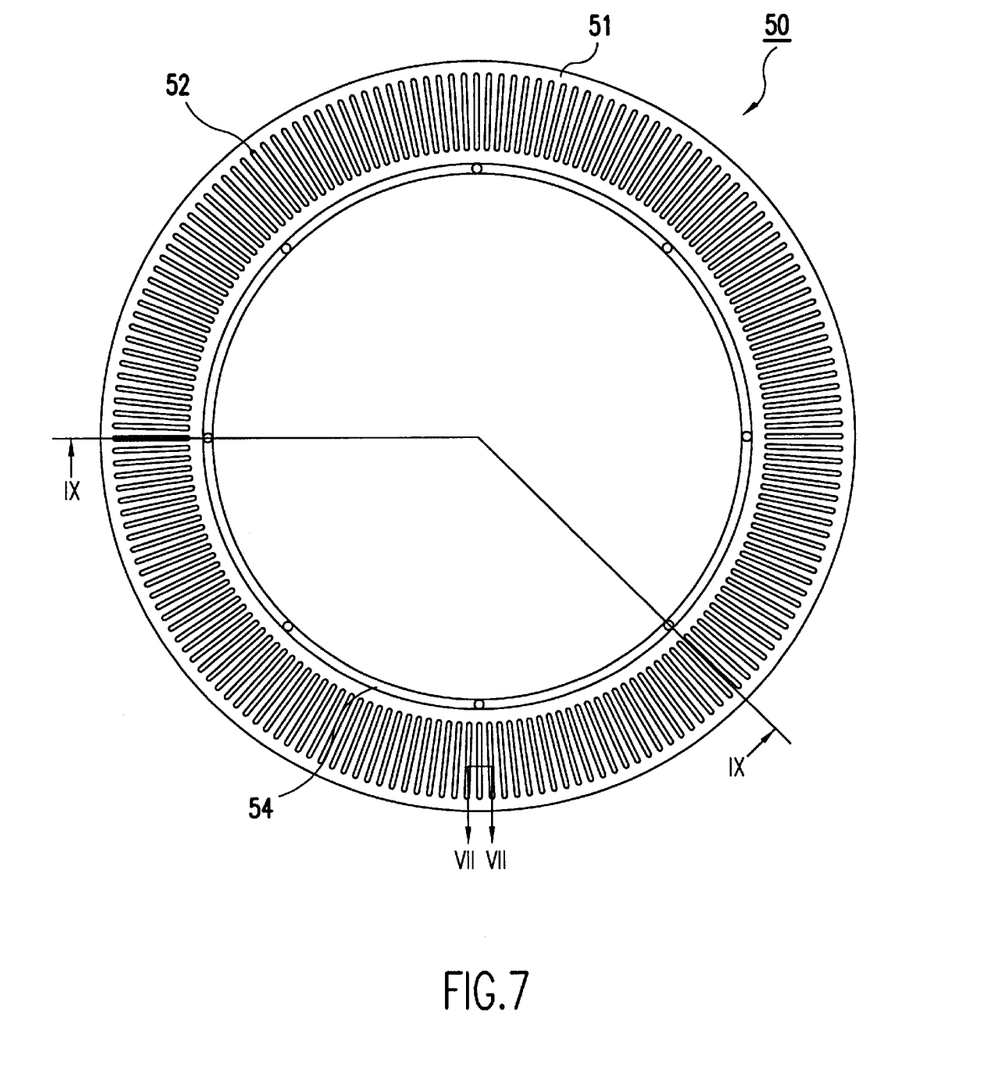
FIG. 7 is a plan view of a baffle plate according to the present invention.

Referring to FIGS. 6 and 7, a baffle plate 50 is disposed between the process chamber 10 and a vacuum chamber 24 placed under the process chamber 10. The baffle plate 50 surrounds the chuck (electrostatic chuck) of the lower electrode 14, such that the inner circumference of the baffle plate 50 confronts the outer circumference of the chuck. The chuck, on which the wafer is mounted, may be either separately or integrally formed with the lower electrode 14.

Figure 8:
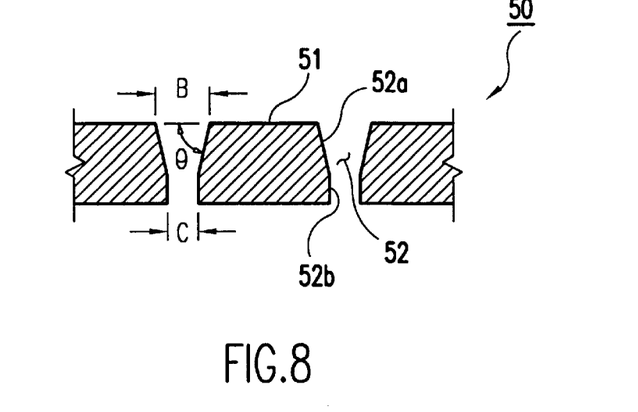
FIG. 8 is a cross-sectional view of the baffle plate in FIG. 7 taken along the line VIII—VIII.
Figure 10:
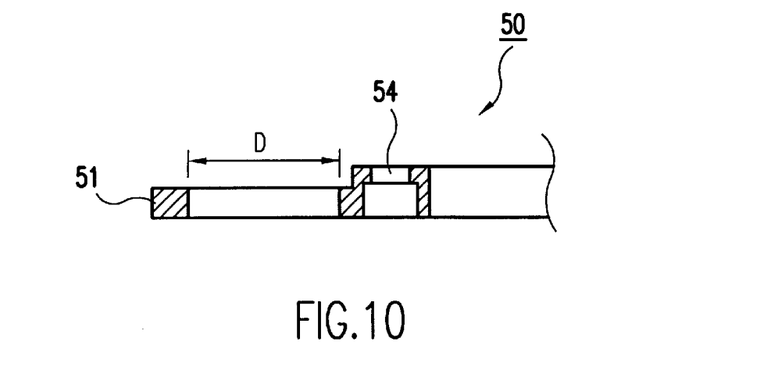
FIG. 10 is an enlarged view of the circled portion X of FIG. 9.

The baffle plate 50 has slits 52, radially formed in an annular ring 51 and circumferentially spaced apart from each other a certain distance, for discharging the non-reacting gases and polymer by-products remaining inside the process chamber 10 to the vacuum chamber 24. Note that the slits 52 have a circumferential width B as shown in FIG. 8 that is narrower than its radial length D as shown in FIG. 10. Preferably, at least forty-five slits 52 are formed, but more or less slits 52 may be formed depending on the capacity of the vacuum pump 18. For example, 180 slits 52 are formed in the embodiment depicted in FIG. 7. One of ordinary skill in the art could readily determine the requisite number of the slits 52 to be employed, depending on several factors including the diameter of the baffle plate 50, the area of the annular ring 51, and the process conditions for the etching process. The baffle plate 50 may be formed from aluminum (Al), and its surface anodized-treated.

Referring to FIGS. 7 and 8, the slits 52 in the annular ring 51 are formed in two distinct sections. The upper section of the slit 52 has an inclined surface, with the widest portion facing the process chamber 10 and thereafter converging as it approaches the lower section. The lower section of the slit 52 facing the vacuum chamber 24 is vertically formed with a constant width. In other words, the upper section 52a of the slit 52 is tapered, with the width of the slit becoming narrower as one progresses from the top surface of the baffle plate 50 to a designated depth within the baffle plate 50. Thereafter, the lower section 52b of the slit 52 has a constant width, ranging from the designated depth down to the bottom surface of the baffle plate 50. The slit 52 thus has a tapered upper section 52a and a vertical lower section 52b that are integrated. The area of the upper section of the slit at the upper surface of the annular ring is greater than that of the lower section of the slit at the bottom surface of the annular ring. Also, the ratio of the vertical height of the tapered upper section 52a and the vertical height of the vertical lower section 52b is preferably 1:1 to 5:1.

Figure 17:
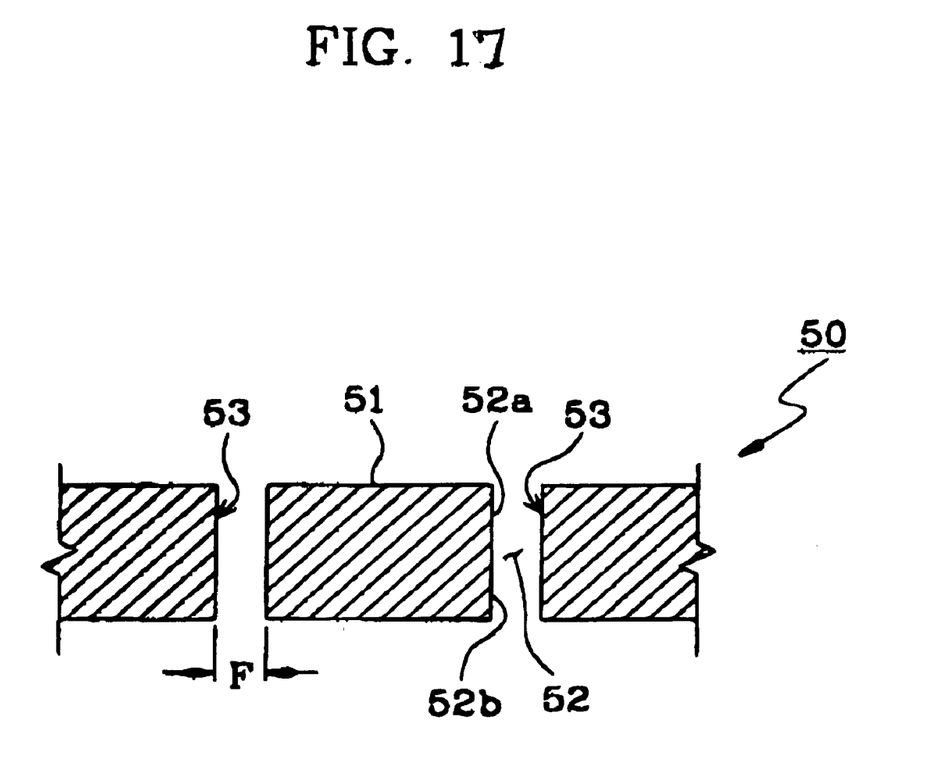
FIG. 17 is a cross-sectional view of an alternate embodiment of the baffle plate of the present invention.

Alternatively, as shown in FIG. 17, the sidewalls 53 of each of the slits 52 of the annular ring 51 may be a vertical surface extending vertically from the top surface to the bottom surface of the annular ring with a same circumferential width F. Therefore, an area of the upper section 52a of the slit 52 is same as that of the lower section 52b of the slit 52.

In the embodiment shown in FIGS. 7 and 8, the baffle plate 50 has 180 slits 52, the outer diameter of the baffle plate 50 is 365 to 366 mm, the inner diameter is about 260 mm, the maximum circumferential width 'B' of the tapered upper section 52a is 1.6 to 2.0 mm, and the minimum circumferential width 'C' of the vertical lower section 52b is 1.0 to 1.2 mm.

Figure 9:
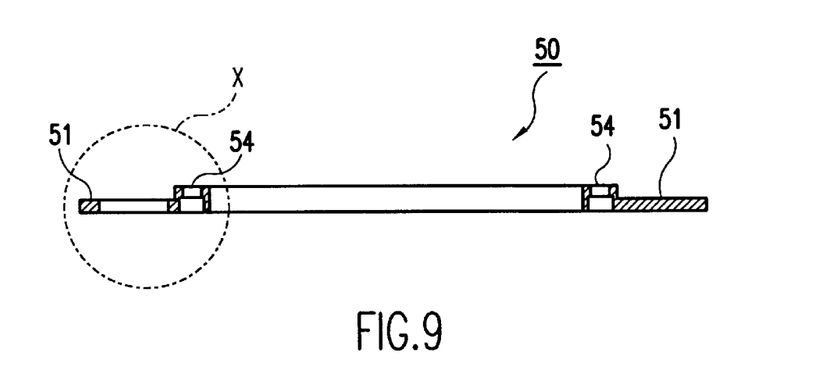
FIG. 9 is a cross-sectional view of the baffle plate in FIG. 7 taken along the line IX—IX.

As shown in FIGS. 7, 9 and 10, a fixing part 54 is installed on the annular ring 51 of the baffle plate 50. The fixing part 54 is installed in order to fix the baffle plate 50 inside the process chamber 10, and typically screw-coupling is used to fix the baffle plate 50 in place. Note that the vertical height of the fixing part 54 is greater than the vertical height of the annular ring 51.

The inner and outer diameters of the baffle plate 50 can be different, depending on several factors, including the structure of the process chamber 10 or the diameter of the chuck.

In the case of a wafer with a diameter of 200 mm, the outer diameter of the baffle plate 50 is approximately 365 to 366 mm, preferably 365.7 mm, and contains 180 slits 52. More preferably, the maximum width 'B' of the tapered upper section 52a of the slit is 1.8 mm, the width 'C' of the vertical lower section 52b of the slit is 1.0 mm, and the thickness of the baffle plate 50 is about 3 mm. In addition, the height of the tapered upper section 52a is 2.0 mm and the height of the vertical lower section 52b is 1.0 mm. As shown in FIG. 8, the inclination angle (θ) of the tapered upper section 52a ranges from 75 to 85°, and preferably 78°.

The structure of the baffle plate 50 as described above reduces the changes in the degree of vacuum in the process chamber 10 as well as minimizes the accumulation of polymer by-products generated in the process chamber 10. This is because the slits 52 are constructed such that they are wider than the conventional slits, and further, the tapered upper section 52a has a more gentle taper than the conventional slits, and finally, the two distinct, but integrated, tapered upper and vertical lower sections provide a more capable structure to reduce accumulation of polymer deposits while increasing the discharging efficiency of the polymer deposits.

Therefore, even if the polymer deposits adhere to the upper surface of the annular ring 51 of the baffle plate 50 and the inside surface of the slit 52, the width of the slit 52 and the taper of the upper tapered section 52a are sufficient to allow the deposits to be discharged to the vacuum chamber 24, thereby minimizing the change in the degree of vacuum inside the process chamber 10. In addition, because the non-reacting gases are easily discharged, the accumulation of the polymer deposits can be minimized, thereby reducing a source of contaminating particles. As a result, the degree of vacuum in the vacuum chamber 24 and that of the process chamber 10 can be maintained substantially the same. Thus, the value displayed by the vacuum indicator 26, which senses the vacuum in the vacuum chamber 24, can be reliably regarded as the degree of vacuum in the process chamber 10.

Even though the present invention reduces accumulation of the polymer deposits, it can not preclude the generation of polymer by-products in the first instance since the etching process employs the same reactant gases as in the conventional case. It is thus still necessary to clean the baffle plate 50, either at regular or irregular intervals, in order to remove the polymer deposits, but the frequency of the cleanings is much less than that of the conventional etching apparatus, leading to increases in the efficiency and reliability of the etching apparatus having the baffle plate 50 as described above.

Figure 11:
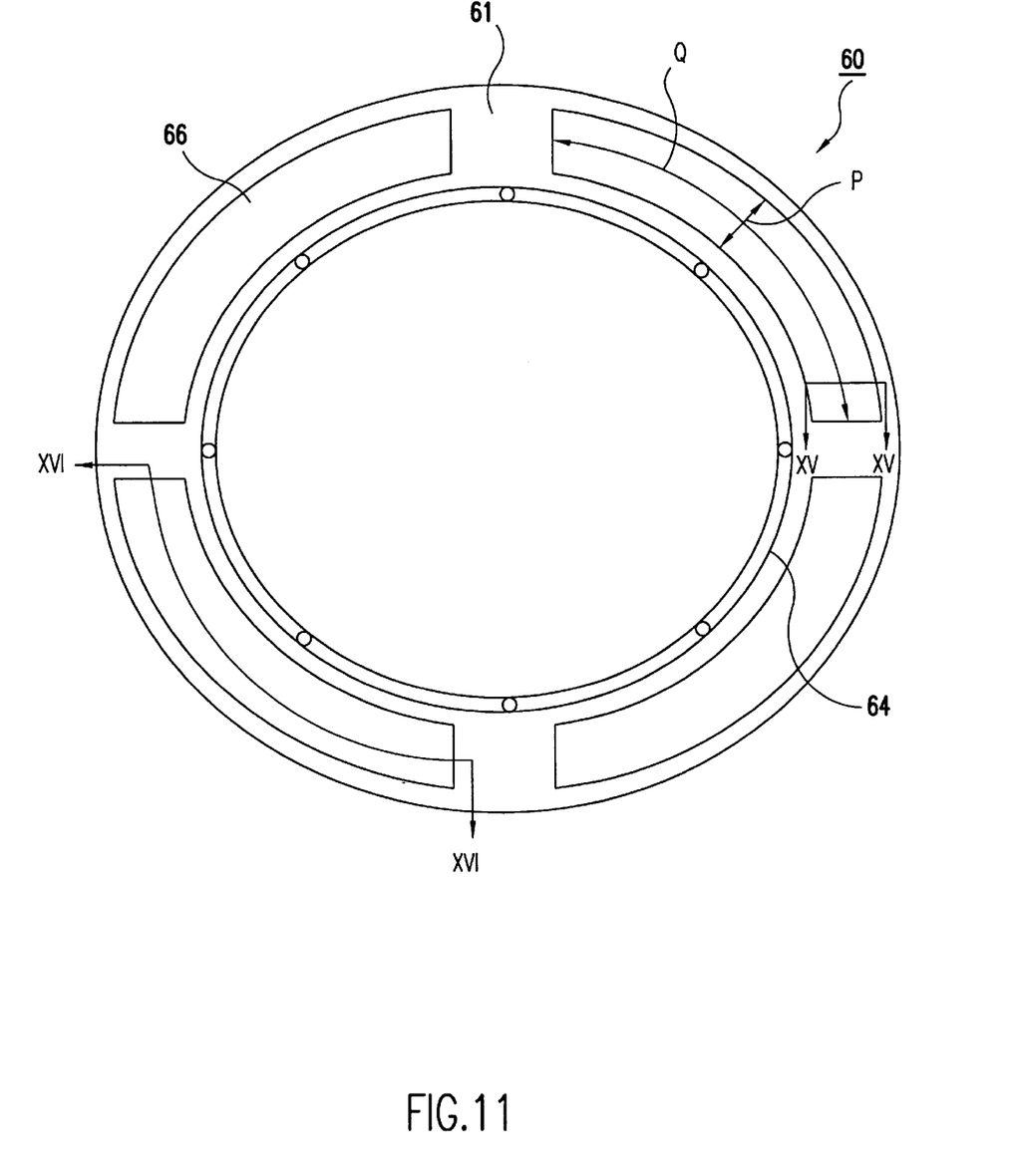
FIG. 11, FIG. 12 and FIG. 13 are plan views of the baffle plate according to other embodiments of the present invention.
Figure 12:
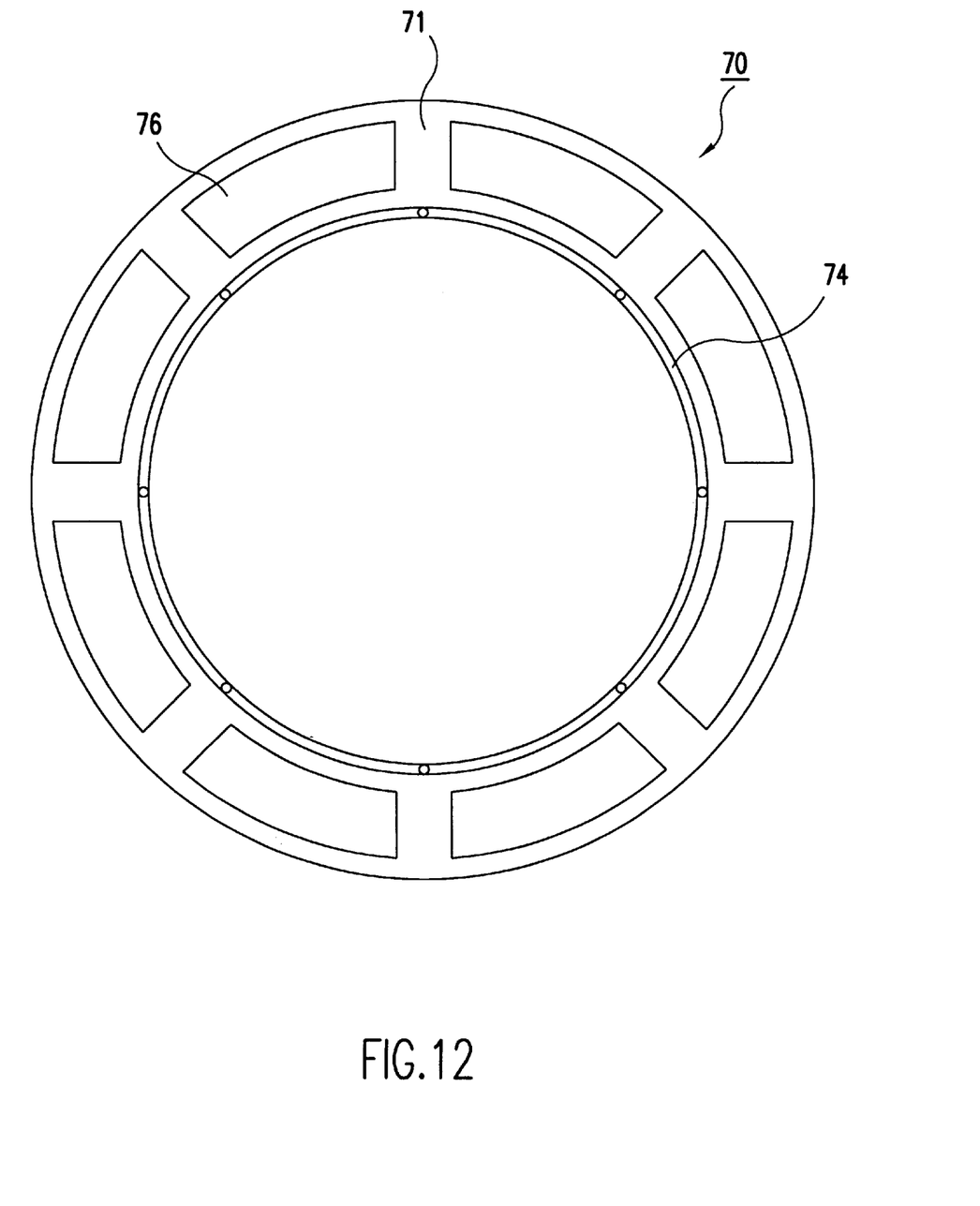
Figure 13:
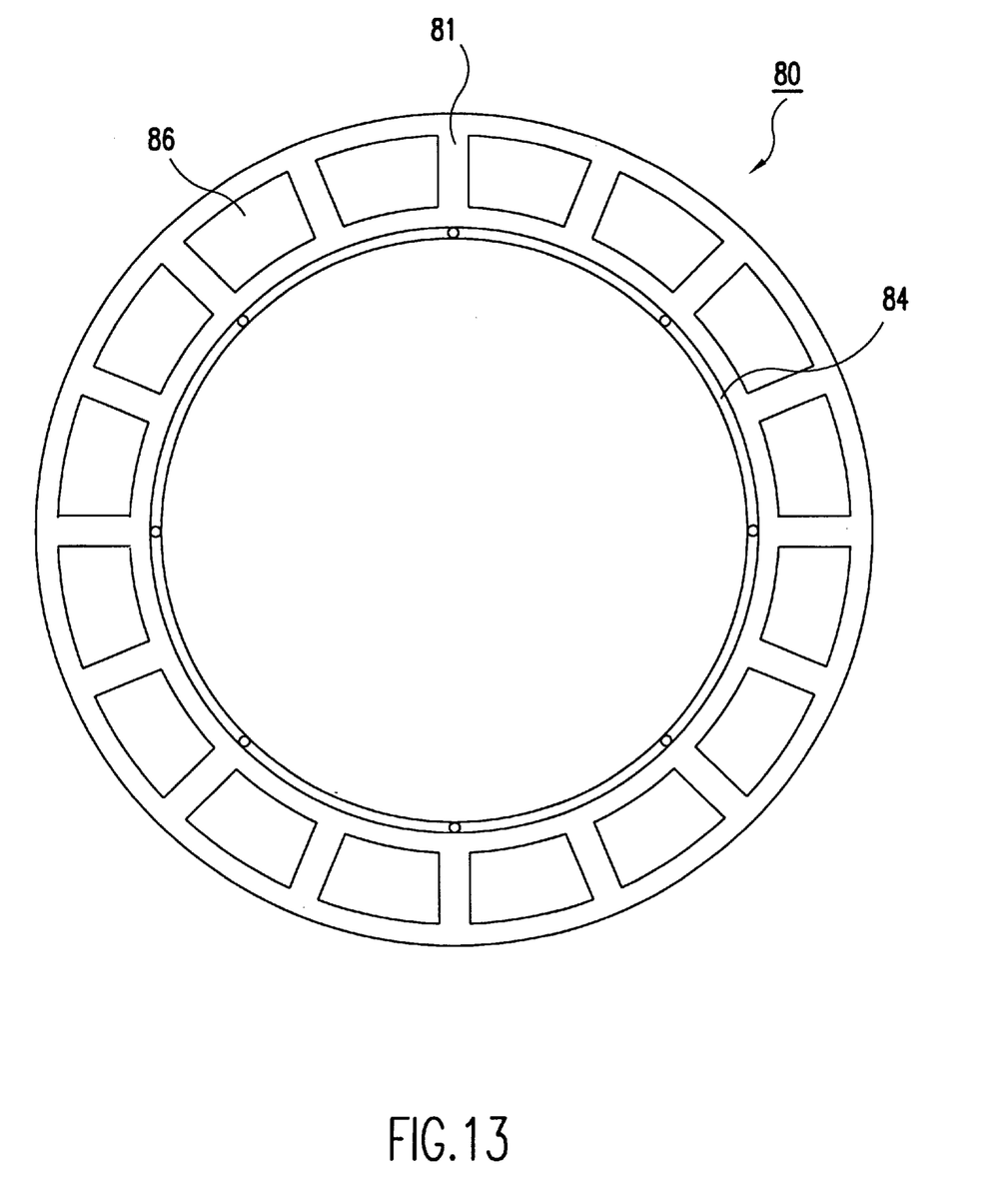

In a second embodiment of the present invention, as shown in FIGS. 11, 12, and 13, the slits 52 are replaced by a plurality of discharging regions 66, 76, 86, in the annular rings 61, 71, 81 of the baffle plates 60, 70, 80, respectively. The discharging regions 66, 76, 86 have a circular arc shape with a particular radial length. The discharging regions 66, 76, 86 perform the same function as the slits 52, that is, discharging the non-reacting gases remaining inside the process chamber 10 to the vacuum chamber 24. Unlike the slits 52, the discharging regions 66, 76, 86 are characterized by a circumferential width Q that is greater than a radial length P.

Preferably, the discharging regions 66, 76, 86 should occupy about 50% or more of the surface area of the annular rings 61, 71, 81 of the baffle plate 60, 70, 80, with each discharging region being spaced apart from the other adjacent regions. Preferably, each of the discharging regions 66, 76, 86 has an equivalent area. Preferably, a circumferential width of the discharging region is greater than a radial length.

Accordingly, as shown in FIG. 11, a baffle plate 60 having 4 discharging regions 66 are formed, as shown in FIG. 12, 8 discharging regions 76 are formed, and in FIG. 13, 16 discharging regions 86 are formed. The requisite number of discharging regions in the annular rings can be easily determined considering the diameter of the baffle plate 60, 70, 80 and the width of the annular rings 61, 71, 81, in much the same manner as the determination of the number of slits 52 in the first embodiment of the invention. The fixing parts 64, 74, 84 in FIGS. 11, 12 and 13 function in the same manner as the fixing part 54 as described with regard to the first embodiment. As before, the baffle plates 60, 70, 80 may be formed from aluminum (Al), and its surface anodized-treated.

Figure 15:
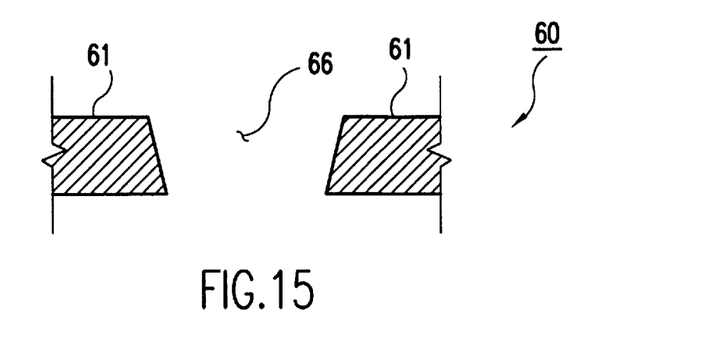
FIG. 15 is a cross-sectional view of the baffle plate in FIG. 11 taken along the line XV—XV.

In addition, the discharging part 66, 76, 86 may be formed such that the inner surface tapers from a wider radial length at the top surface to a narrower radial length at the bottom surface as shown in FIG. 15. Accordingly, the area of the upper section of the discharging region is greater than that of the lower section of the discharging region.

Figure 16:
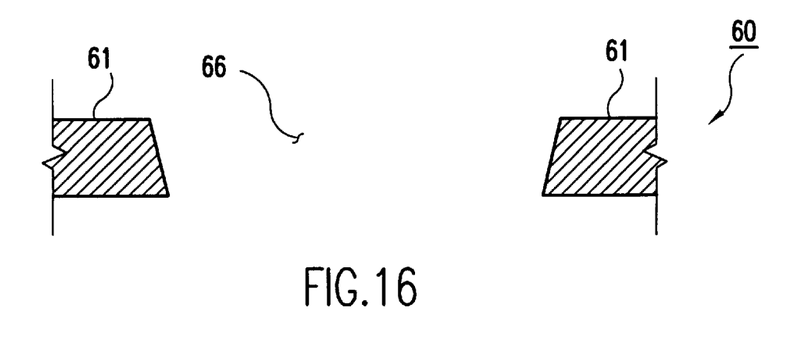
FIG. 16 is a cross-sectional view of the baffle plate in FIG. 11 taken along the line XVI—XVI.

Moreover, the discharging part 66, 76, 86 may be formed such that the inner surface tapers from a wider circumferential width at the top surface to a narrower circumferential width at the bottom surface as shown in FIG. 16.

Like the slits 52 in the first embodiment, the discharging regions 66, 76, 86 efficiently discharge the non-reacting gases remaining inside the process chamber 10, thereby preventing the accumulation of polymer by-products generated by the process reaction.

Now hereinafter, a description of the embodiments of the present invention will be provided in the context of an etching operation, using the etching apparatus having the baffle plates 50, 60, 70, 80 as described above, to form contact holes in a layer deposited on a semiconductor substrate wafer W.

$CHF_3$ gas is used as the main reaction gas, and CO gas is used as the supplementary reaction gas. The precise process conditions for the formation of the contact holes, such as the degree of vacuum, temperature, duration, etc., can be readily determined by those skilled in the art according to the purpose of the manufacturer.

During the etching process a polymer by-product is generated by the reaction of the main reaction gases and the supplementary reaction gases. The baffle plates 50, 60, 70, 80 incorporating the unique slits 52 or discharging regions 66, 76, 86 facilitate the efficient transfer of the non-reacting gases from the process chamber 10 to the vacuum chamber 24, thereby reducing the accumulation of the polymer deposits on the baffle plates and in the process chamber. This is made possible by the greater width and the gentle tapered cross-sections of the slits/discharging regions.

Figure 14:
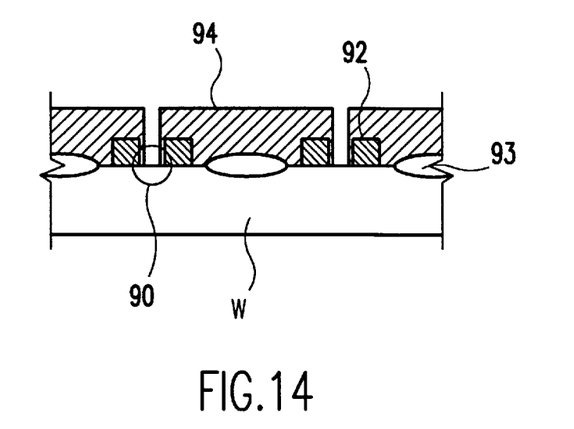
FIG. 14 is a cross-sectional view of contact holes formed on a semiconductor device using the apparatus of the present invention.

Accordingly, as shown in FIG. 14 and compared with FIG. 5, contact holes can be formed in a certain layer 94 on a semiconductor substrate wafer W such that the bottom portion 90 of the contact holes is open to the wafer W. Reference numeral 92 refers to a gate electrode 92 and 93 refers to a field oxide film.

Thus, the present invention, by improving the structure of the slits 52 and the discharging regions 66, 76, 86 of the baffle plates of the etching apparatus, makes it possible to reduce the change in the degree of vacuum inside the process chamber 10 due to the polymer deposits generated by non-reacting gases remaining therein, as well as minimizing the accumulation of contaminating particles. By minimizing the changes in the degree of vacuum in the process chamber, productivity of the etching apparatus is improved, and by minimizing the particle generation, the reliability of the semiconductor devices manufactured can be improved.

The baffle plates 50, 60, 70, 80 of the present invention can be employed in plasma etching apparatus using either magnetic and electrical fields for generating the plasma.

It will be apparent to those skilled in the art that various modifications and variations of the present invention can be made without departing from the spirit or scope of the invention. Thus, it is intended that the present invention cover the modifications and variations of this invention that come within the scope of the appended claims and their equivalents.

What is claimed is:

1. A baffle plate disposed between a process chamber and a vacuum chamber of a dry etching apparatus for manufacturing semiconductor devices, the baffle plate comprising:

an annular ring have an inner circumferential edge and an outer circumferential edge; and a plurality of slits formed radially along the annular ring and extending from a top surface of the annular ring to a bottom surface of the annular ring, the slits being circumferentially spaced from each other, each of the slits having an upper section extending at a positive slope from the top surface of the annular ring to a particular depth within the annular ring such that the upper section is tapered, and a lower section extending vertically from the particular depth to the bottom surface of the annular ring, wherein a circumferential width of the upper section at the top surface of the annular ring is greater than a circumferential width at the particular depth, and wherein the circumferential width at the particular depth is equal to the circumferential width at the bottom surface of the annular ring, such that the lower section has a constant width.

2. The baffle plate as claimed in the claim 1, wherein the plurality of the slits is more than 45.

3. The baffle plate as claimed in the claim 2, wherein the plurality of the slits is 180.

4. The baffle plate as claimed in the claim 3, wherein a diameter of the baffle plate ranges between 365 to 366 mm, the circumferential width of the upper section at the top surface of the annular ring ranges between 1.6 to 2.0 mm, and the circumferential width of the lower section ranges between 1.0 to 1.2 mm.

5. The baffle plate as claimed in the claim 1, wherein the ratio of a vertical height of the tapered upper section of the slit and a vertical height of the lower section of the slit ranges between 1:1 to 5:1.

6. The baffle plate as claimed in the claim 1, wherein the tapered upper section forms surfaces that are inclined at an angle between 75° to 85°.

7. The baffle plate as claimed in the claim 1, wherein the tapered upper section forms surfaces that are inclined at an angle of 78°.

8. The baffle plate as claimed in the claim 1, wherein the baffle plate is made of aluminum, and surfaces of the baffle plate are anodized.

9. A baffle plate disposed between a process chamber and a vacuum chamber of a dry etching apparatus for manufacturing semiconductor devices, the baffle plate comprising:

an annular ring have an inner circumferential edge and an outer circumferential edge; and a plurality of discharging regions, formed circumferentially along the annular ring, having a circular arc shape with a radial length and extending from a top surface of the annular ring to a bottom surface of the annular ring, the discharging regions being circumferentially spaced from each other, each discharging region having the same area, with a combined area of the plurality of discharging regions being more than 50% of the area of the annular ring.

10. The baffle plate as claimed in the claim 9, wherein a circumferential width of the discharging regions is greater than the radial length.

11. The baffle plate as claimed in the claim 9, wherein a circumferential width of the discharging region at the top surface of the annular ring is greater than a circumferential width at the bottom surface of the annular ring, such that the discharging region is tapered.

12. The baffle plate as claimed in the claim 9, wherein the radial length of the discharging region at the top surface of the annular ring is greater than the radial length at the bottom surface of the annular ring, such that the discharging region is tapered.

13. The baffle plate as claimed in the claim 9, wherein the plurality of discharging regions is 4.

14. The baffle plate as claimed in the claim 9, wherein the plurality of discharging regions is 8.

15. The baffle plate as claimed in the claim 9, wherein the plurality of discharging regions is 16.

16. The baffle plate as claimed in the claim 9, wherein the baffle plate is made of aluminum, and surfaces of the baffle plate are anodized.

17. A baffle plate disposed between a process chamber and a vacuum chamber of a dry etching apparatus for manufacturing semiconductor devices, the baffle plate comprising:

an annular ring have an inner circumferential edge and an outer circumferential edge; and a plurality of slits formed radially along the annular ring and extending from a top surface of the annular ring to a bottom surface of the annular ring, the slits being circumferentially spaced from each other, each of the slits having a vertical surface extending vertically from the top surface to the bottom surface of the annular ring, wherein an area of an upper section of the slit is equal to an area of a lower section of the slit.

* * * * *